US008673699B2

(12) United States Patent
Adam et al.

(10) Patent No.: US 8,673,699 B2
(45) Date of Patent: Mar. 18, 2014

(54) SEMICONDUCTOR STRUCTURE HAVING NFET EXTENSION LAST IMPLANTS

(75) Inventors: Thomas N. Adam, Slingerlands, NY (US); Kangguo Cheng, Schenectady, NY (US); Bruce B. Doris, Brewster, NY (US); Bala S. Haran, Watervliet, NY (US); Pranita Kulkarni, Slingerlands, NY (US); Amlan Majumdar, White Plains, NY (US); Stefan Schmitz, Ballston Spa, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/551,054

(22) Filed: Jul. 17, 2012

(65) Prior Publication Data
US 2014/0024181 A1 Jan. 23, 2014

(51) Int. Cl.
*H01L 21/00* (2006.01)

(52) U.S. Cl.
USPC .......... 438/154; 438/166; 257/347; 257/350; 257/351; 257/E21.415; 257/E29.02; 257/E21.632

(58) Field of Classification Search
USPC ................. 438/154, 166; 257/347, E29.285, 257/E21.415, E29.02, 350, 351, E21.632
See application file for complete search history.

(56) References Cited

U.S. PATENT DOCUMENTS

| 4,072,545 | A | * | 2/1978 | De La Moneda | 438/294 |
| 5,079,180 | A | * | 1/1992 | Rodder et al. | 438/297 |
| 5,516,707 | A | | 5/1996 | Loh et al. | |
| 6,157,064 | A | * | 12/2000 | Huang | 257/344 |
| 6,344,396 | B1 | * | 2/2002 | Ishida et al. | 438/286 |
| 6,346,447 | B1 | * | 2/2002 | Rodder | 438/300 |
| 6,429,083 | B1 | * | 8/2002 | Ishida et al. | 438/305 |
| 6,429,084 | B1 | * | 8/2002 | Park et al. | 438/305 |
| 6,746,924 | B1 | * | 6/2004 | Lee et al. | 438/286 |
| 6,891,228 | B2 | * | 5/2005 | Park et al. | 257/346 |
| 6,982,216 | B1 | * | 1/2006 | Yamashita | 438/525 |
| 7,009,258 | B2 | * | 3/2006 | Park et al. | 257/369 |
| 7,118,980 | B2 | | 10/2006 | Jain | |
| 7,176,481 | B2 | | 2/2007 | Chen et al. | |

(Continued)

OTHER PUBLICATIONS

Csepregi et al., "Reordering of amorphous layers of Si implanted with 31P, 75As, and 11B ions", Journal of Applied Physics, vol. 48, pp. 4234-4240 (1977).*

(Continued)

*Primary Examiner* — Zandra Smith
*Assistant Examiner* — Victor Barzykin
(74) *Attorney, Agent, or Firm* — Law Offices of Ira D. Blecker, P.C.

(57) ABSTRACT

A method of forming a semiconductor structure which includes an extremely thin silicon-on-insulator (ETSOI) semiconductor structure having a PFET portion and an NFET portion, a gate structure in the PFET portion and the NFET portion, a high quality nitride spacer adjacent to the gate structures in the PFET portion and the NFET portion and a doped faceted epitaxial silicon germanium raised source/ drain (RSD) in the PFET portion. An amorphous silicon layer is formed on the RSD in the PFET portion. A faceted epitaxial silicon RSD is formed on the ETSOI adjacent to the high quality nitride in the NFET portion. The amorphous layer in the PFET portion prevents epitaxial growth in the PFET portion during formation of the RSD in the NFET portion. Extensions are ion implanted into the ETSOI underneath the gate structure in the NFET portion.

11 Claims, 20 Drawing Sheets

(56) References Cited

U.S. PATENT DOCUMENTS

| | | | |
|---|---|---|---|
| 7,553,763 B2* | 6/2009 | Hsiao et al. | 438/659 |
| 7,592,270 B2 | 9/2009 | Teo et al. | |
| 7,714,358 B2 | 5/2010 | Liu et al. | |
| 7,808,001 B2* | 10/2010 | Takeoka | 257/69 |
| 7,825,003 B2* | 11/2010 | Gauthier et al. | 438/423 |
| 7,855,105 B1* | 12/2010 | Jagannathan et al. | 438/142 |
| 8,030,708 B2* | 10/2011 | Tateshita | 257/369 |
| 8,124,427 B2* | 2/2012 | Berliner et al. | 438/14 |
| 8,169,024 B2* | 5/2012 | Cheng et al. | 257/347 |
| 2006/0128111 A1* | 6/2006 | Beintner et al. | 438/400 |
| 2007/0257315 A1 | 11/2007 | Bedell et al. | |
| 2008/0179636 A1* | 7/2008 | Chidambarrao et al. | 257/255 |
| 2008/0217686 A1* | 9/2008 | Majumdar et al. | 257/347 |
| 2009/0039426 A1* | 2/2009 | Cartier et al. | 257/344 |
| 2009/0140338 A1* | 6/2009 | Gauthier et al. | 257/350 |
| 2009/0280614 A1* | 11/2009 | Chen et al. | 438/305 |
| 2009/0289305 A1* | 11/2009 | Majumdar et al. | 257/351 |
| 2010/0120263 A1 | 5/2010 | Hsueh et al. | |
| 2011/0027956 A1 | 2/2011 | Domenicucci et al. | |
| 2011/0049630 A1* | 3/2011 | Majumdar et al. | 257/351 |
| 2011/0163359 A1* | 7/2011 | Zhu | 257/288 |
| 2011/0230030 A1* | 9/2011 | de Souza et al. | 438/303 |
| 2011/0254090 A1* | 10/2011 | Cheng et al. | 257/347 |
| 2011/0309446 A1* | 12/2011 | Doris et al. | 257/351 |
| 2012/0049284 A1* | 3/2012 | Doris et al. | 257/350 |
| 2012/0061759 A1* | 3/2012 | Cheng et al. | 257/347 |
| 2012/0104498 A1* | 5/2012 | Majumdar et al. | 257/351 |
| 2012/0108026 A1* | 5/2012 | Nieh et al. | 438/300 |
| 2012/0153393 A1* | 6/2012 | Liang et al. | 257/347 |
| 2012/0153398 A1* | 6/2012 | Baars et al. | 257/369 |
| 2012/0187523 A1* | 7/2012 | Cummings et al. | 257/506 |
| 2012/0241868 A1* | 9/2012 | Tsai et al. | 257/369 |
| 2012/0256278 A1* | 10/2012 | Zhang et al. | 257/411 |
| 2012/0261757 A1* | 10/2012 | Doris et al. | 257/351 |
| 2012/0286364 A1* | 11/2012 | Cheng et al. | 257/369 |
| 2012/0299101 A1* | 11/2012 | Babich et al. | 257/347 |
| 2012/0313168 A1* | 12/2012 | Cheng et al. | 257/347 |
| 2013/0015525 A1* | 1/2013 | Cheng et al. | 257/351 |

OTHER PUBLICATIONS

A. Majumdar et al., "High-Performance Undoped-Body 8-nm-Thin SOI Field-Effect Transistors," IEEE Electron Device Letters, vol. 29, Issue 5, May 2008, pp. 515-517.

A. Majumdar et al., "Gate Length and Performance Scaling of Undoped-Body Extremely Thin SOI MOSFETs," IEEE Electron Device Letters, vol. 30, Issue:4, Apr. 2009, pp. 413-415.

K. Cheng et al., "Extremely thin SOI (ETSOI) CMOS with record low variability for low power system-on-chip applications," 2009 IEEE International Electron Devices Meeting (IEDM), Dec. 7-9, 2009, 4 pages.

R. Lindsay et al., "Optimisation of Junctions formed by Solid Phase Epitaxial Regrowth for sub-70nm CMOS," Mat. Res. Soc. Symp. Proc. vol. 717, 2002, pp. C.2.1-C.2.12.

Prosecution History of related U.S. Appl. No. 13/551,100, Notice of Allowance having a mailing date of May 24, 2013.

* cited by examiner

SEMICONDUCTOR STRUCTURE HAVING NFET EXTENSION LAST IMPLANTS

RELATED APPLICATION

This application is related to U.S. patent application Ser. No. 13/551,100, entitled "SEMICONDUCTOR STRUCTURE HAVING NFET EXTENSION LAST IMPLANTS" and filed even date herewith, the disclosure of which is incorporated by reference herein.

BACKGROUND

The present invention relates to semiconductor structures and, more particularly, to semiconductor structures having NFET extension last implants.

ETSOI (extremely thin silicon-on-insulator) is a leading candidate for continued scaling of planar silicon technology. Successful introduction of ETSOI into manufacturing requires integration of n-type metal oxide semiconductor (nMOS) and p-type metal oxide semiconductor (pMOS) devices with high performance and low leakage. ETSOI devices naturally have low leakage currents due to the extremely thin SOI layer (typically less than 10 nm). However, this extremely thin SOI layer often leads to high series resistance that lowers drive current and degrades performance. A key feature to reduce series resistance in ETSOI and therefore, improve performance is the use of raised source/drain (RSD) epitaxy. Ideal junction design for ETSOI devices with RSD epitaxy involves (i) low source/drain resistance (ii) low extension resistance and (iii) good link-up between source/drain and extension.

BRIEF SUMMARY

The various advantages and purposes of the exemplary embodiments as described above and hereafter are achieved by providing, according to a first aspect of the exemplary embodiments, a method of forming a semiconductor structure which includes: obtaining an extremely thin semiconductor-on-insulator (ETSOI) wafer having a PFET portion where a p-type field effect transistor (PFET) will be formed and an NFET portion where an n-type field effect transistor (NFET) will be formed; forming at least one gate structure in the PFET portion and at least one gate structure in the NFET portion; depositing a high quality nitride over the PFET portion and the NFET portion, the high quality nitride being unetchable in dilute hydrofluoric acid (HF); depositing a low quality nitride over the high quality nitride, the low quality nitride being etchable in dilute HF; etching the PFET portion to remove the high quality nitride and low quality nitride except for high quality nitride and low quality nitride adjacent to the at least one gate structure in the PFET portion; etching the PFET portion and the NFET portion to remove the low quality nitride; forming a doped faceted epitaxial silicon/germanium (SiGe) on the ETSOI adjacent to the high quality nitride and the at least one gate structure in the PFET portion to form a faceted raised source/drain (RSD) in the PFET portion and an amorphous portion on the high quality nitride; depositing a low quality nitride over the PFET portion and the NFET portion; etching the PFET portion to remove the low quality nitride while maintaining the low quality nitride adjacent to the high quality nitride and at least one gate structure to form disposable spacers from the low quality nitride adjacent to the high quality nitride and etching the NFET portion to remove the low quality nitride and high quality nitride except for high quality nitride and low quality nitride adjacent to the at least one gate structure in the NFET portion, the low quality nitride adjacent to the at least one gate structure in the NFET portion forming disposable spacers; ion implanting into the RSD in the PFET portion to render amorphous a top portion of the RSD in the PFET portion; etching the disposable spacers adjacent to the at least one gate structure in the NFET portion and the PFET portion to leave at least the high quality nitride adjacent to the at least one gate structure in the PFET portion and at least the high quality nitride adjacent to the at least one gate structure in the NFET portion; forming a faceted epitaxial silicon RSD on the ETSOI adjacent to the at least one structure in the NFET portion; performing a rapid thermal anneal; ion implanting extensions into the ETSOI underneath the at least one gate structure in the NFET portion; and performing a short time scale anneal to activate the NFET extension implants but not diffuse them.

According to a second aspect of the exemplary embodiments, there is provided a method of forming a semiconductor structure which includes: providing a semiconductor structure comprising an extremely thin semiconductor on insulator (ETSOI) wafer having a PFET portion where a p-type field effect transistor (PFET) will be formed and an NFET portion where an n-type field effect transistor (NFET) will be formed, at least one gate structure in the PFET portion and at least one gate structure in the NFET portion, a high quality nitride spacer adjacent to the at least one gate structure in the PFET portion and a high quality nitride spacer adjacent to the at least one gate structure in the NFET portion, the high quality nitride being unetchable in dilute hydrofluoric acid (HF), and a doped faceted epitaxial silicon germanium raised source/drain (RSD) in the PFET portion; forming an amorphous silicon layer on the RSD in the PFET portion; forming a faceted epitaxial silicon RSD on the ETSOI adjacent to the high quality nitride in the NFET portion; performing a rapid thermal anneal; ion implanting extensions into the ETSOI underneath the at least one gate structure in the NFET portion; and performing a short time scale anneal to activate the NFET extension implants but not diffuse them.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The figures are for illustration purposes only and are not drawn to scale. The exemplary embodiments, both as to organization and method of operation, may best be understood by reference to the detailed description which follows taken in conjunction with the accompanying drawings in which:

FIGS. 1 to 20 illustrate the processing to form a semiconductor structure according to the exemplary embodiments in which:

FIG. 1 illustrates the formation of gate structures on an ETSOI semiconductor substrate having PFET and NFET portions;

FIG. 2 illustrates the deposition of a high quality nitride on the ETSOI substrate and gate structures;

FIG. 3 illustrates the deposition of a low quality nitride on the high quality nitride;

FIG. 4 illustrates the masking of the NFET portion while etching the low quality nitride and high quality nitride in the PFET portion;

FIG. 5 illustrates the stripping of the mask from the NFET portion;

FIG. 6 illustrates the etching of the low quality nitride;

FIG. 7 illustrates the formation of a doped epitaxial raised source/drain (RSD) on the PFET portion;

FIG. 8 illustrates the deposition of a low quality nitride on the semiconductor structure;

FIG. 9 illustrates the etching of the low quality nitride in the PFET and NFET portions and the etching of the high quality nitride in the NFET portion;

FIG. 10 illustrates the masking of the NFET portion and the formation of an amorphous layer on the RSD in the PFET portion;

FIG. 11 illustrates the stripping of the mask from the NFET portion;

FIG. 12 illustrates the etching of the remaining low quality nitride from the PFET and NFET portions and the forming of the RSD in the NFET portion;

FIGS. 13 to 16 illustrate the doping of the RSD in the NFET portion if it was not doped when formed;

FIG. 17 illustrates the masking of the PFET portion and the ion implanting of extensions in the NFET portion;

FIG. 18 illustrates the removal of the mask from the PFET portion and the short time scale anneal of the NFET portion to activate the extensions;

FIG. 19 illustrates the formation of nitride spacers in the PFET and NFET portions; and FIG. 20 illustrates the formation of a silicide layer in the PFET and NFET portions.

DETAILED DESCRIPTION

In the exemplary embodiments, an extension last complementary metal oxide semiconductor (CMOS) integration scheme is demonstrated with the following key elements for 20 nm node and beyond: (i) in-situ boron doped (ISBD) silicon germanium to reduce PFET series resistance, (ii) extension last NFET and (iii) metal-gate/high-k gate structure.

Figure 1:
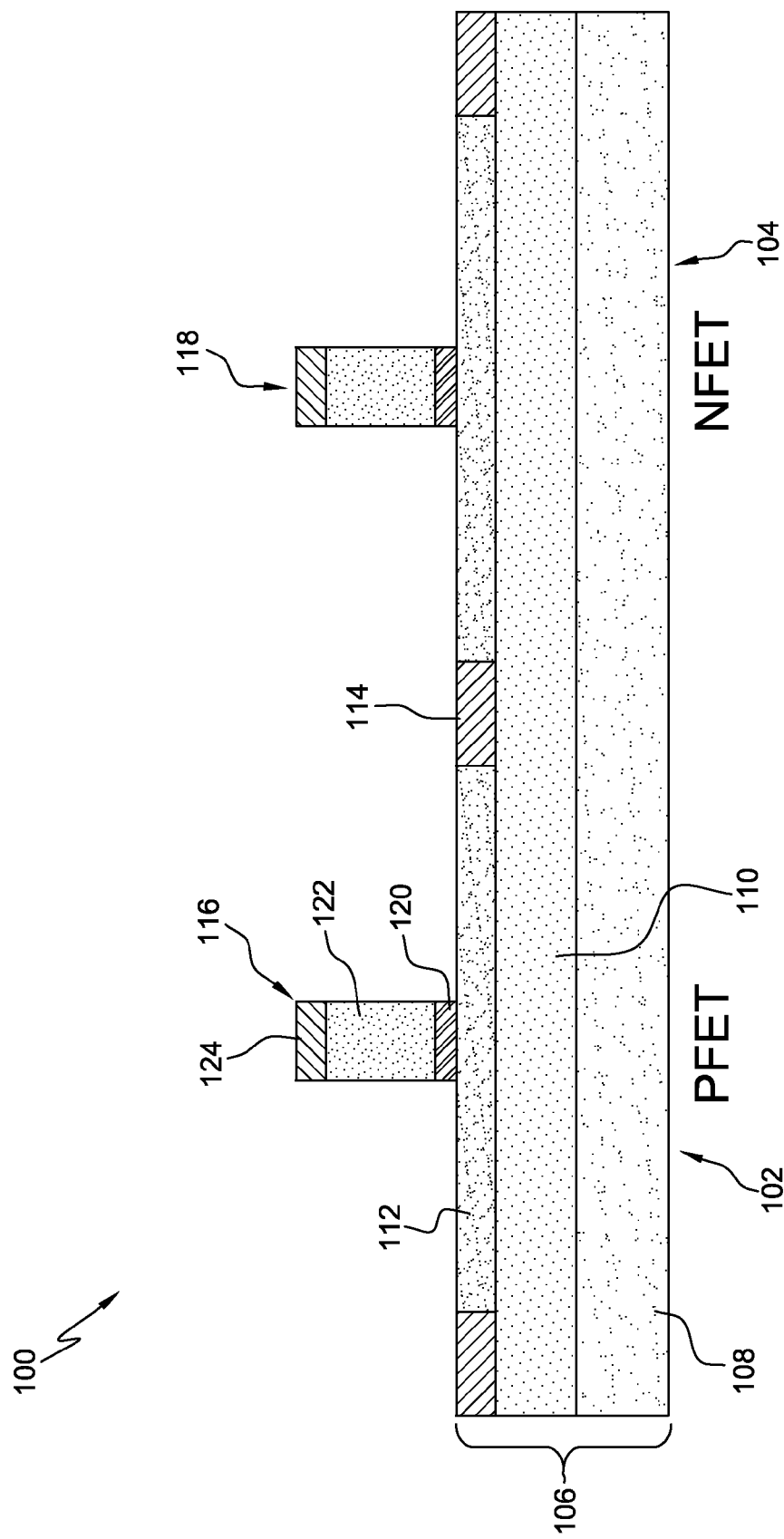

Referring to the Figures in more detail, and particularly referring to FIG. 1, there is shown a semiconductor structure 100 having a p-type field effect transistor (PFET) portion 102 and an n-type field effect transistor (NFET) portion 104. The PFET portion 102 is fabricated using pMOS technology while the NFET portion 104 is fabricated using nMOS technology.

The semiconductor structure 100 is fabricated using an ETSOI wafer 106 which includes a semiconductor substrate 108, usually silicon, a buried oxide layer 110 (also referred to as a BOX layer) and an ETSOI layer 112. The semiconductor substrate 108 may be made from semiconductor materials other than silicon. The ETSOI layer 112 may have a thickness of about 2 to 10 nanometers which is substantially thinner than a typical SOI layer. The semiconductor structure 100 may also include shallow trench isolation (STI) 114 to separate the PFET portion 102 from the NFET portion 104. The ETSOI wafer 106 having STI 114 may be fabricated by conventional processing.

Semiconductor structure 100 may further include at least one gate structure 116 on PFET portion 102 and at least one gate structure 118 on the NFET portion. Each of the gate structures 116, 118 includes a gate dielectric 120, a gate conductor 122 and a nitride cap 124. Preferably, the gate dielectric 120 is a high-k gate dielectric and the gate conductor 122 is a metal gate conductor. The gate structures 116, 118 may be fabricated by depositing layers of gate dielectric, gate conductor and gate nitride followed by gate definition including photolithography, reactive ion etching (RIE) and resist strip. While there is only one PFET portion 102 and one NFET portion 102 shown in the Figures, it should be under-stood that the semiconductor structure 100 will typically have many such PFET portions 102 and NFET portions 104, each having at least one gate structure.

Figure 2:
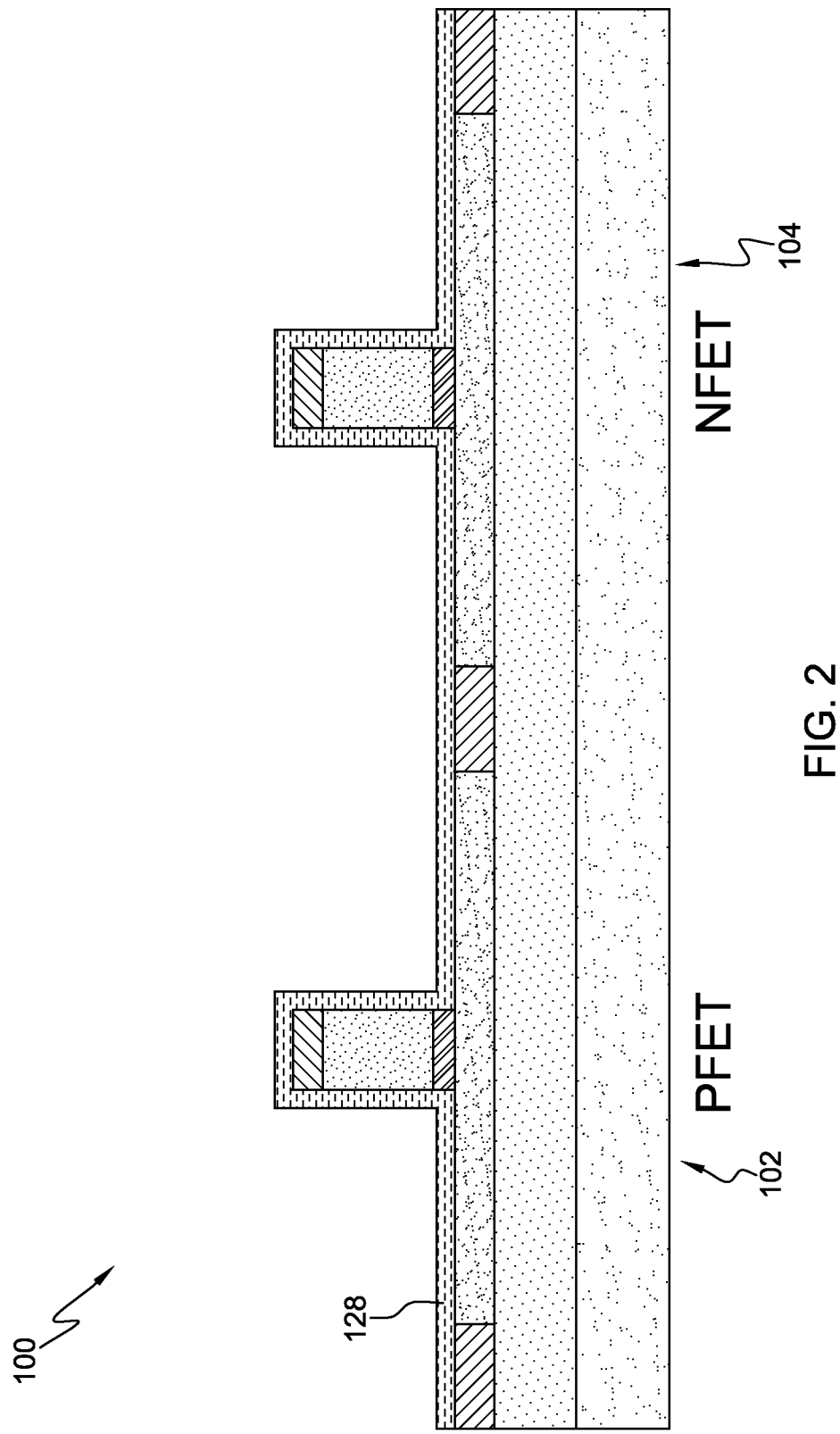
Figure 3:
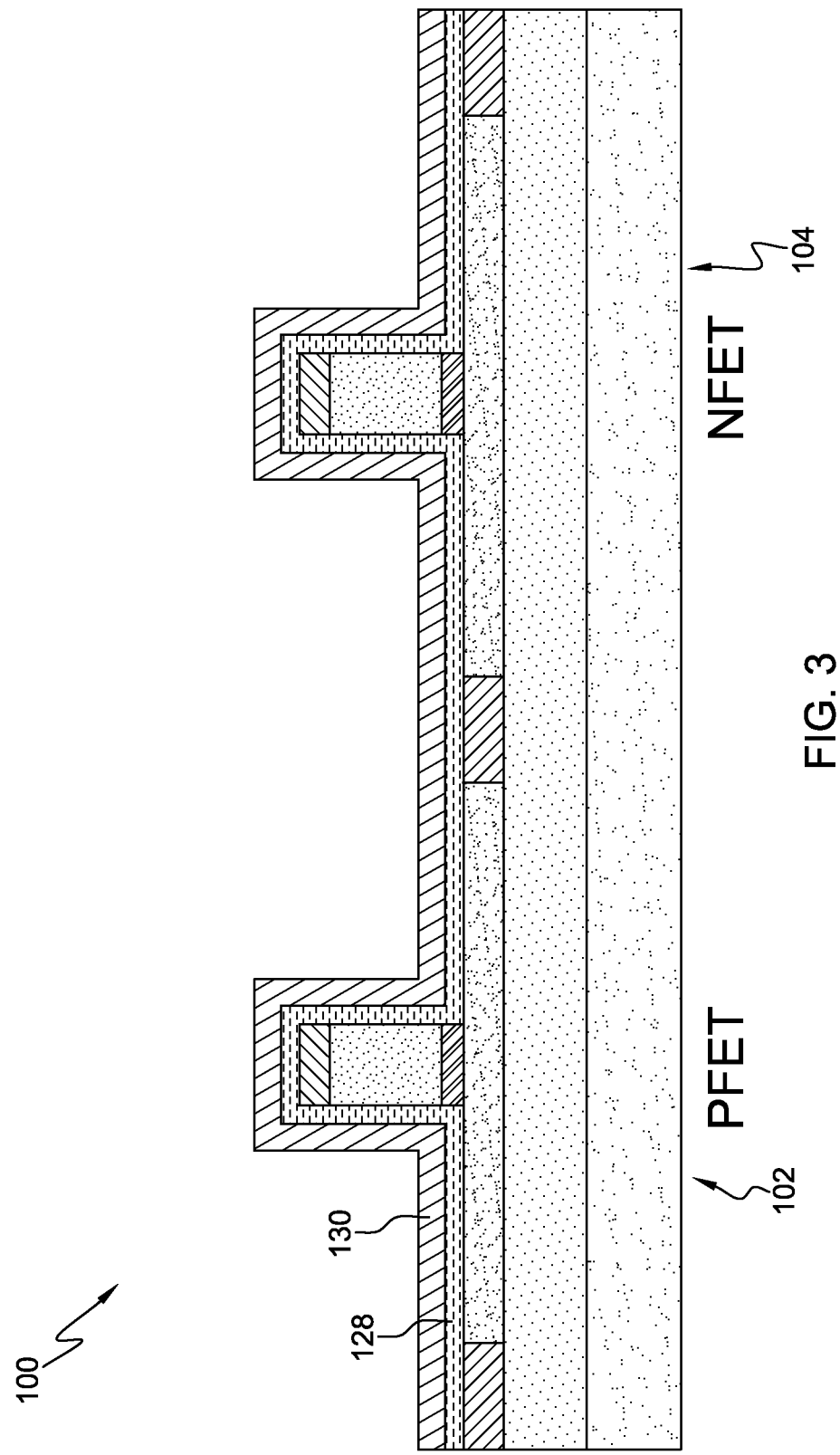

Referring now to FIG. 2, about 2 to 5 nanometers of a high quality nitride 128 is deposited everywhere. A high quality nitride is a nitride that has an etch rate in dilute hydrofluoric (HF) acid of less than about 1 nanometer per minute. Dilute HF may be defined as typically $HF:H_2O$ (water)=1:50 but may also range from 1:10 to 1:100. Some examples of high quality nitrides are nitrides deposited by low-pressure chemical vapor deposition (LPCVD) and rapid-thermal chemical vapor deposition (RTCVD).

Thereafter, as shown in FIG. 3, 2 to 5 nanometers of a low quality nitride 130 is deposited over the high quality nitride 128. A low quality nitride is a nitride that has an etch rate in dilute HF of more than about 10 nanometers per minute. Therefore, the low quality nitride etches at least 10 times faster than the high quality nitride in dilute HF. Some examples of low quality nitrides are nitrides deposited by plasma-enhanced chemical vapor deposition (PECVD).

Figure 4:
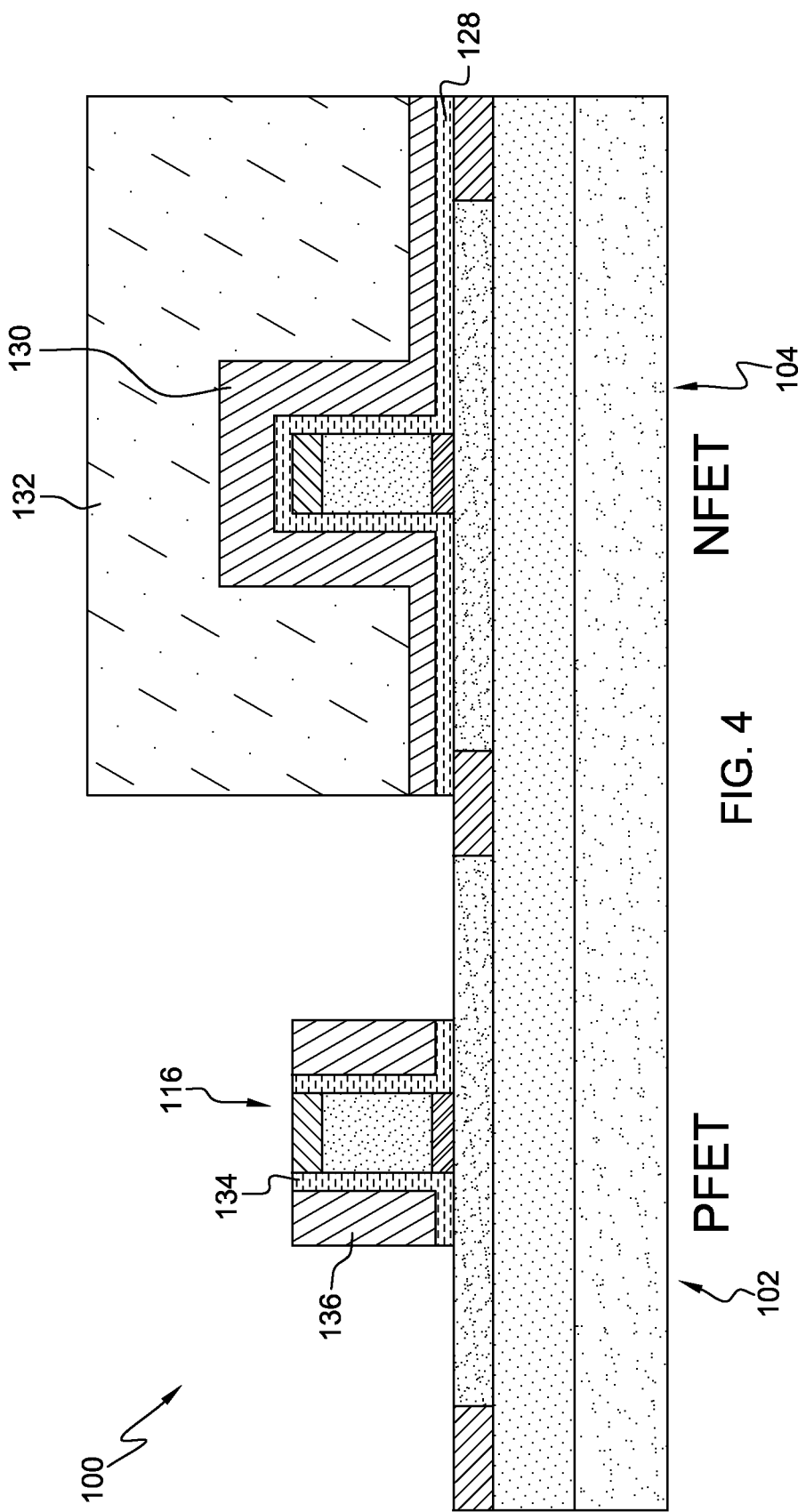

Referring now to FIG. 4, a photoresist mask 132 is defined to cover the NFET portion 104 of the semiconductor structure 100. Thereafter, by a two-step RIE process, the low quality nitride 130 and the high quality nitride 128 are etched in the PFET portion 102. The nitride RIE is performed using inductively coupled plasma (ICP) with hydrogen ($H_2$) and fluorine-based chemistry. The fluorine-based gases may be hexa-fluoro-ethane ($C_2F_6$), octa-fluoro-cyclobutane ($C_4F_8$), and sulphur hexafluoride ($SF_6$). The gas ratios and ICP power may be adjusted to obtain anisotropic etch and selectivity to silicon and $SiO_2$. The ICP power also determines the nitride etch rate with higher power leading to higher etch rates (that is, the nitride etch is more aggressive). In the two-step RIE process, the ICP power may be first kept low during the etch of the low quality nitride 130 and then increased during the etch of the high quality nitride 128.

What remains are L-shaped spacers 134 of the high quality oxide 128 and disposable spacers 136 of the low quality nitride 130. The L-shaped spacers 134 and disposable spacers 136 are adjacent to gate structure 116.

Figure 5:
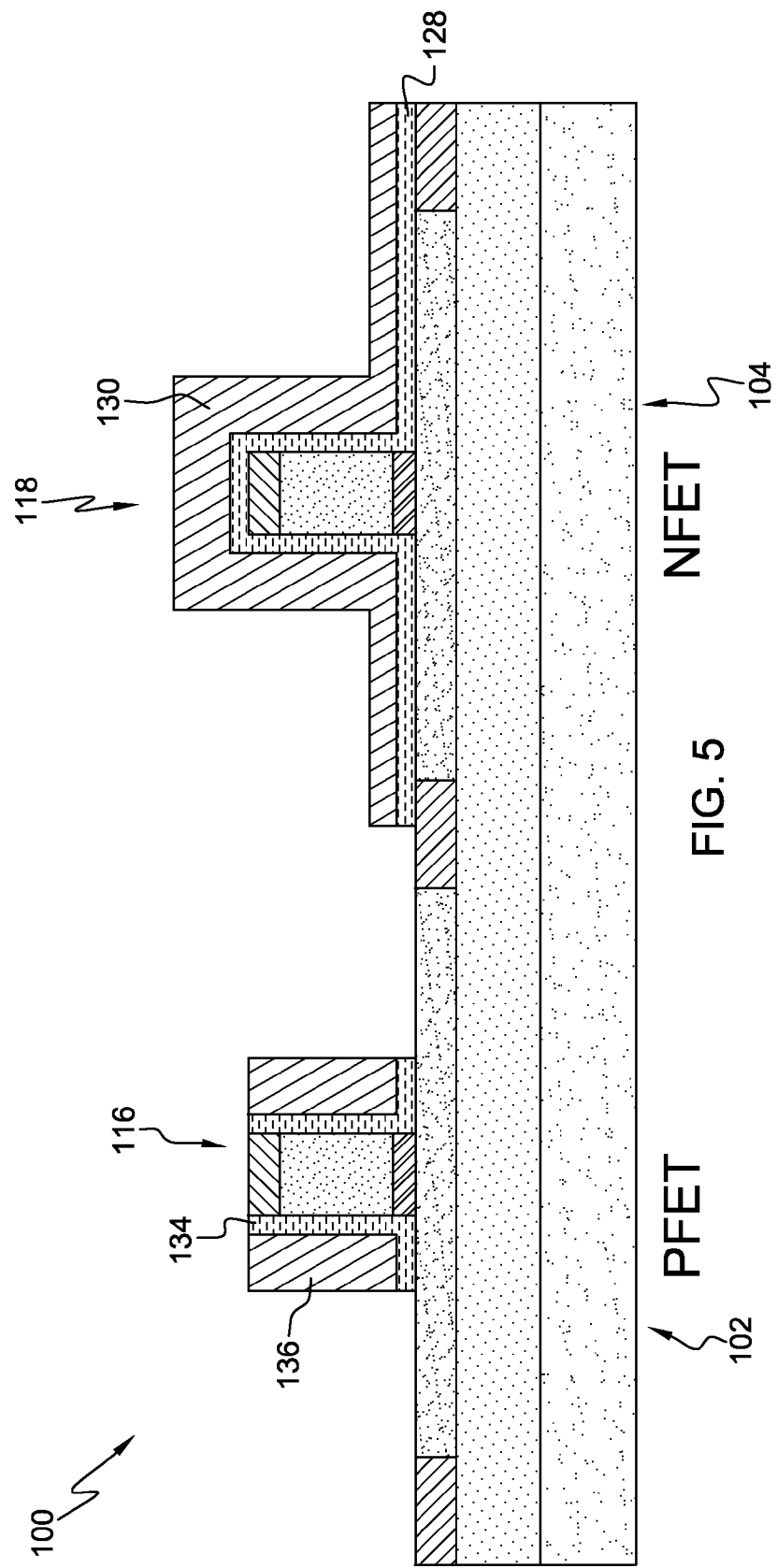

The photoresist mask 132 is then stripped to result in the structure shown in FIG. 5.

Figure 6:
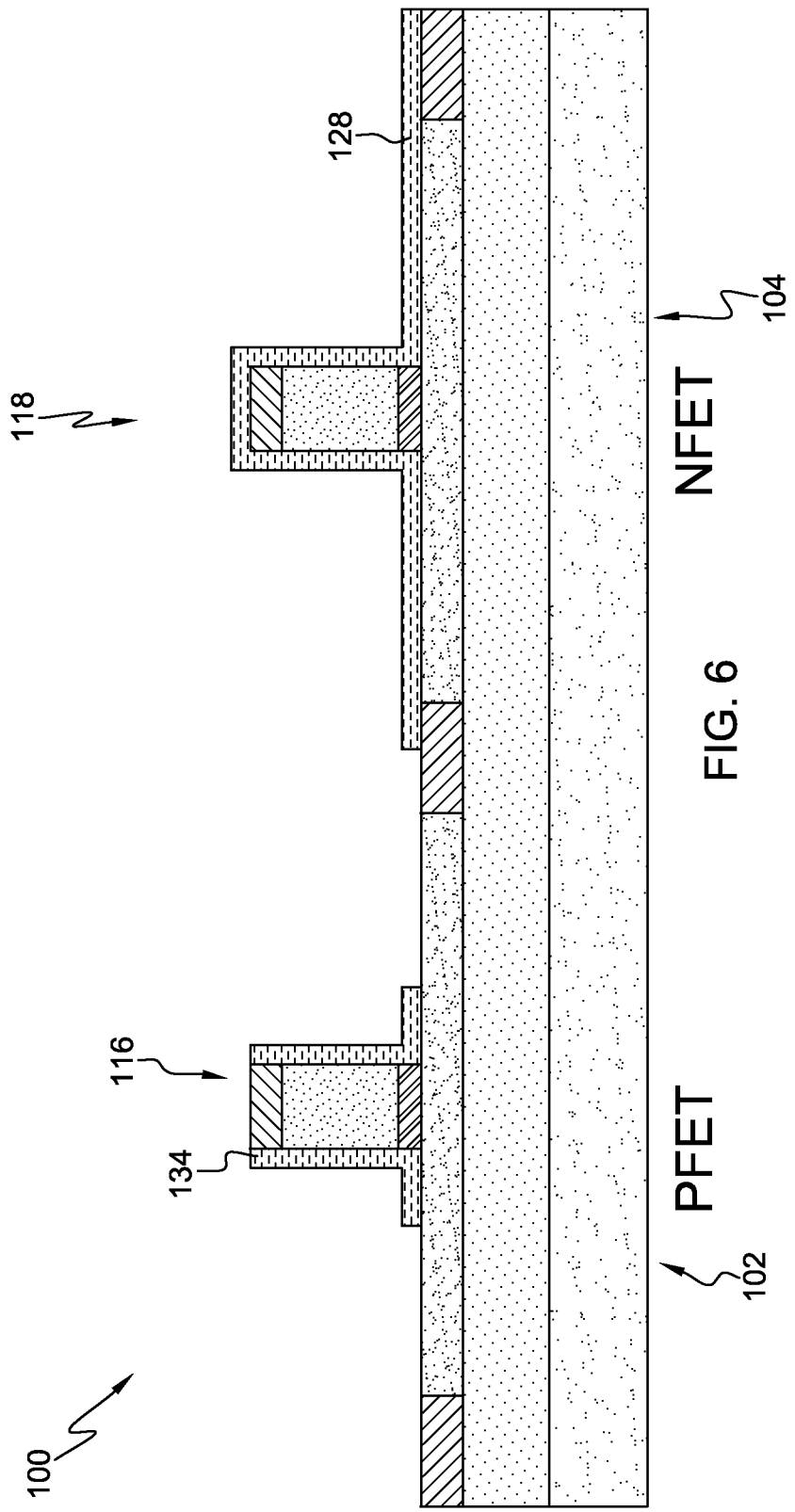

Thereafter, the disposable spacers 136 may be removed from the PFET portion 102 and the low quality nitride 130 is removed from the NFET portion 104 by a dilute HF etch as shown in FIG. 6.

Figure 7:
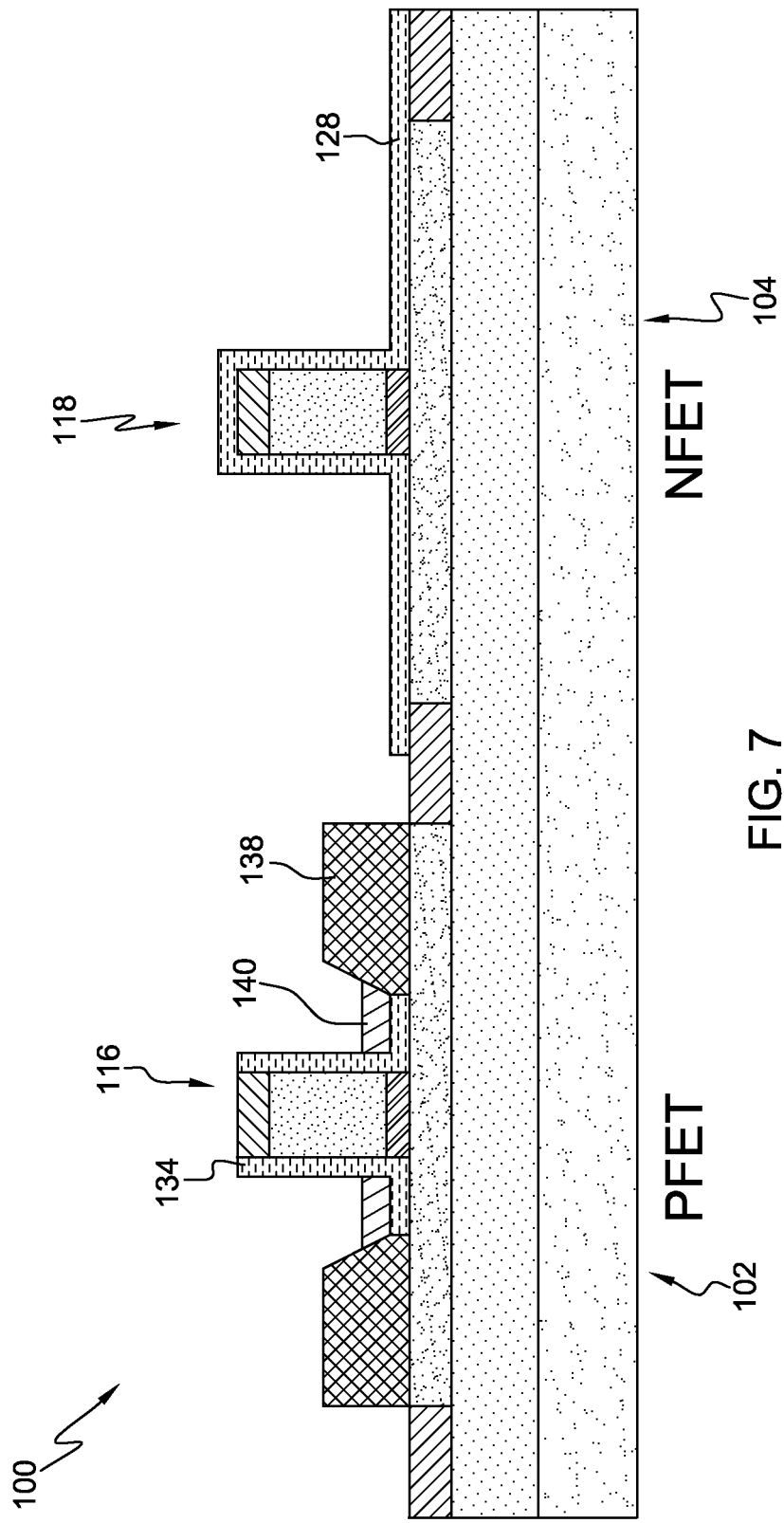

Referring now to FIG. 7, in-situ boron doped (ISBD) silicon germanium (SiGe) may be epitaxially grown on the PFET portion to form the raised source/drain (RSD) 138. The high quality nitride 128 serves as a mask to prevent deposition of SiGe on the NFET portion 104.

The SiGe epitaxy may be performed using chemical vapor deposition (CVD). Typical epitaxy temperature is in the 600-850° C. range and pressure in the 1-100 torr range. The exact process temperature and pressure are chosen based on (i) the requirement that the SiGe epitaxy must be selective to oxide and nitride, that is, crystalline SiGe is deposited only on exposed crystalline Si, and crystalline SiGe is not deposited on exposed oxide (STI regions) and exposed nitride (PFET cap and spacers 134, and NFET high quality nitride 128), (ii) the desired Ge concentration in SiGe, and (iii) the gas sources of Si and Ge used in the process. Typical gases used may be (i) silane ($SiH_4$), dicholorosilane ($SiH_2Cl_2$), or silicon tetrachloride ($SiCl_4$) as source of Si, and (ii) germane ($GeH_4$), germanium tetrachloride ($GeCl_4$), or isobutyl germane ($C_4H_{12}Ge=(CH_3)_2CHCH_2GeH_3$) as source of Ge.

The RSD 138 will be faceted due to the growth conditions of the ISBD SiGe. However, the portion 140 of the ISBD SiGe that grows on the L-shaped spacers 134 will be amorphous due to the L-shaped spacers 134 being noncrystalline (being formed of high quality nitride). No amorphous SiGe may grow on nitride 128 since it is noncrystalline and there is no crystalline seed to start growth of even amorphous SiGe.

Figure 8:
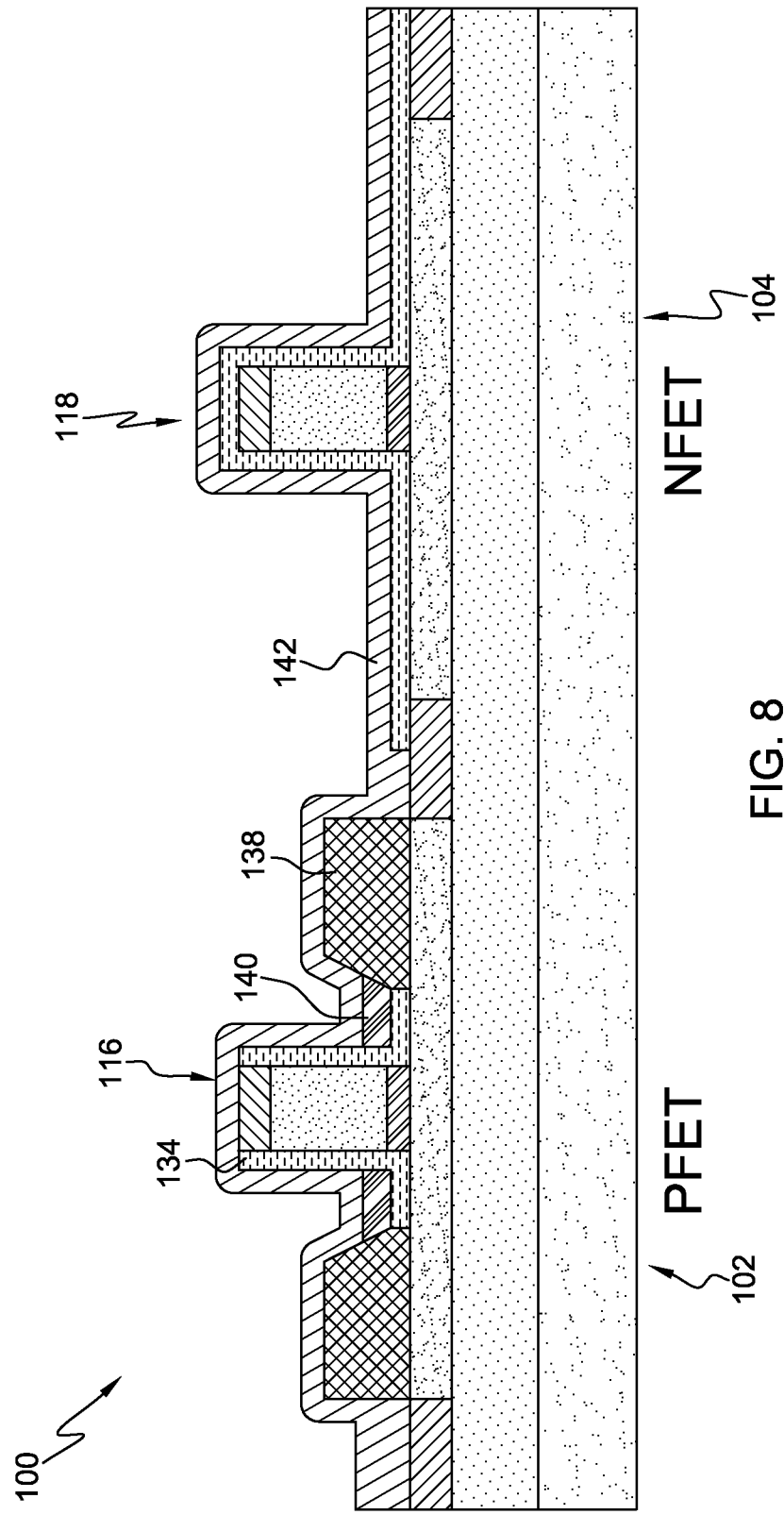

Then, as shown in FIG. 8, another low quality nitride layer 142 may be deposited on the semiconductor structure 142. The low quality nitride layer 142 has a thickness of about 2 to 5 nanometers.

Figure 9:
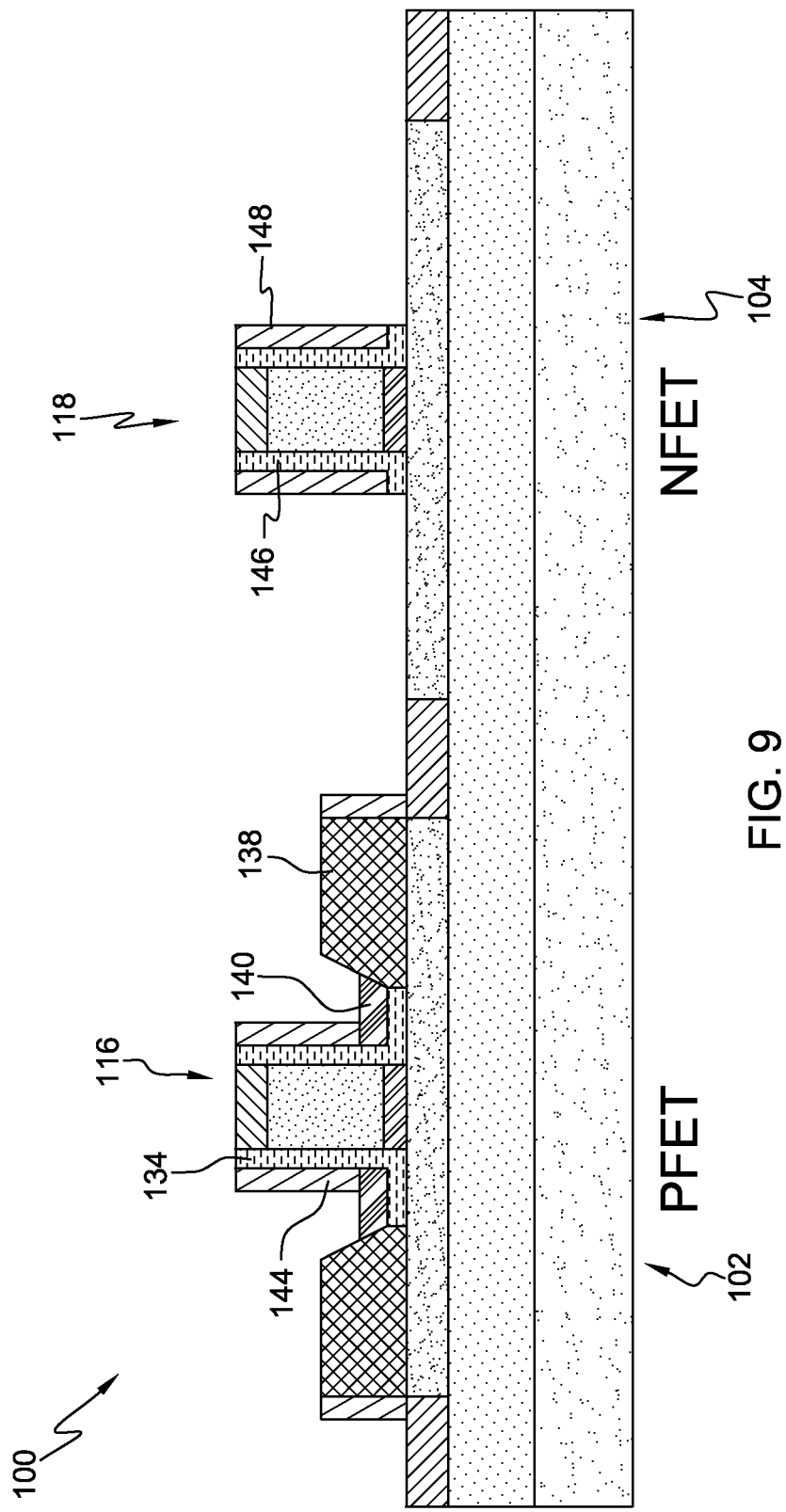

The semiconductor structure 100 shown in FIG. 8 then undergoes another two-step RIE process to remove horizontal portions of the low quality nitride layer 142 in both the PFET portion 102 and the NFET portion 104 and then remove the high quality nitride 128 from portions of the NFET portion 104 that are not protected by the low quality nitride. The operating parameters of the two-step RIE process may be similar to the two-step RIE process employed earlier. The resulting structure is shown in FIG. 9 where the PFET portion 102 contains disposable spacers 144 adjacent to the L-shaped spacers 134 and the NFET portion 104 contains L-shaped spacers 146 and disposable spacers 148. The L-shaped spacers 146 and disposable spacers 148 are adjacent to the gate structure 118.

Figure 10:
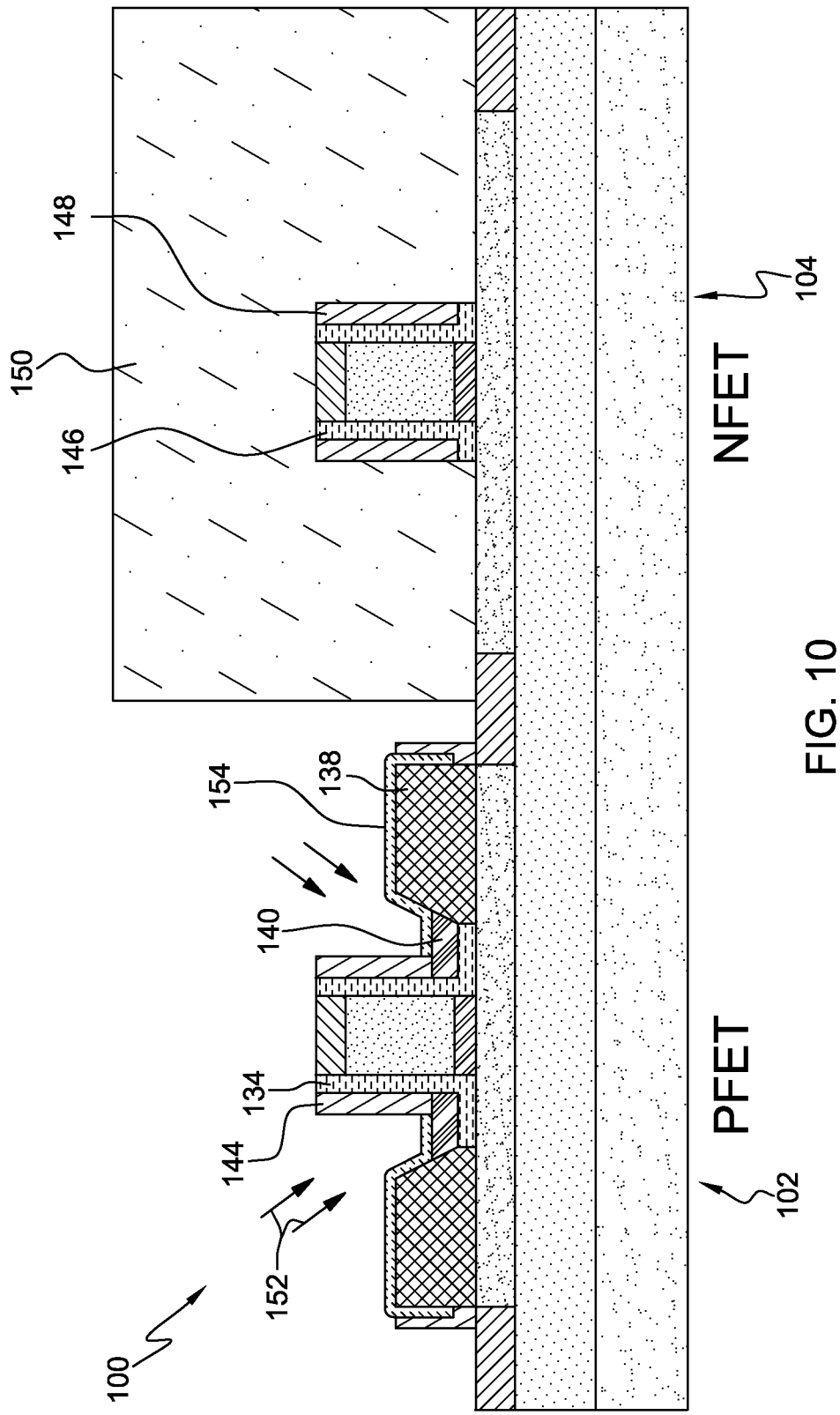

Referring now to FIG. 10, a photoresist mask 150 is defined over the NFET portion 104. Then, the PFET portion 102 undergoes ion implanting 152 to form implanted layer 154. The ion implanting causes the crystalline RSD 138 to become amorphous within layer 154. The implanted layer 154 over the buffer portion 140 should also be amorphous since buffer portion 140 is amorphous. The implant species may be B or $BF_2$ or neutral species such as Si, Ge, Xe, Ar or $N_2$.

Figure 11:
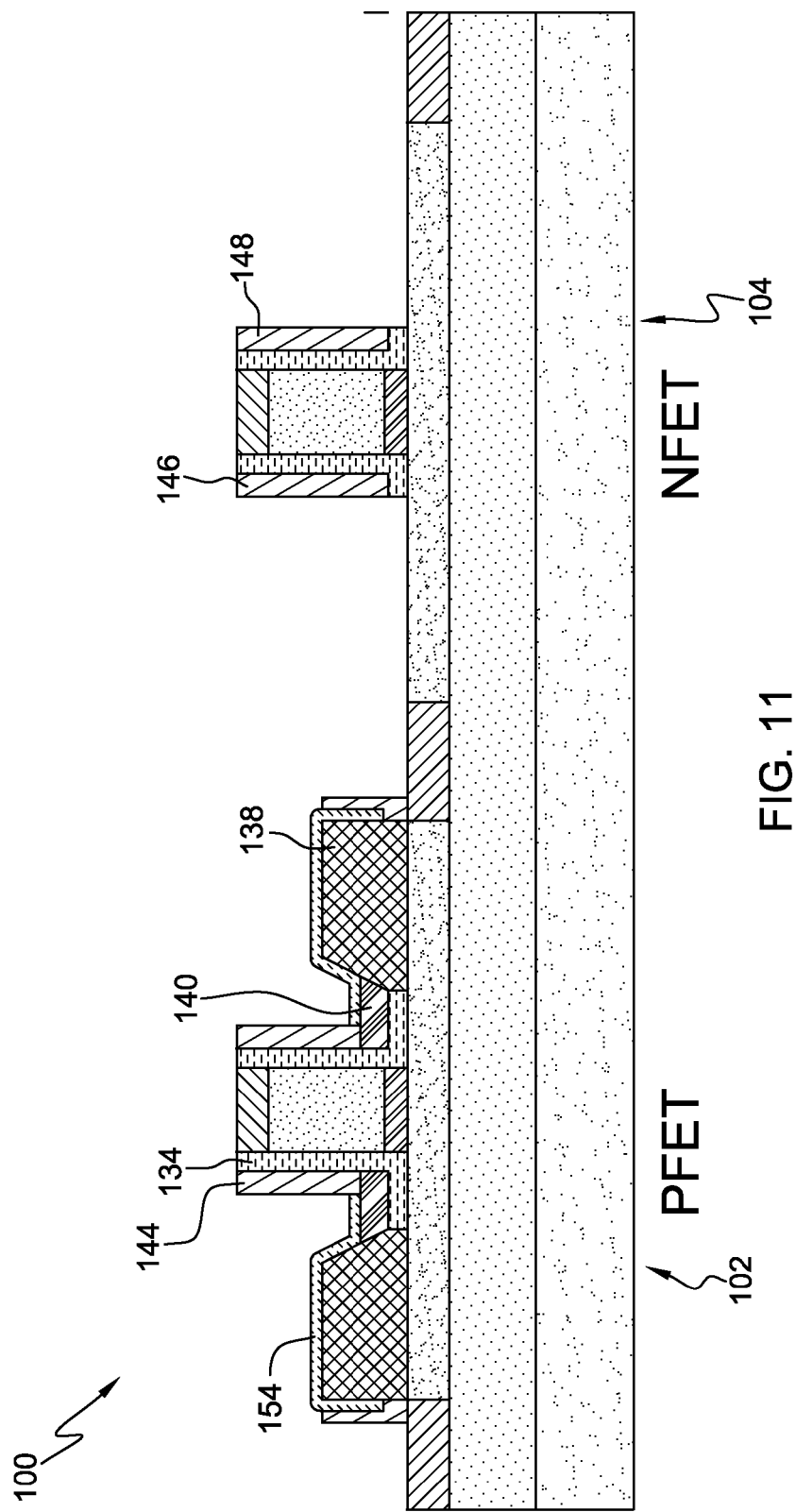

The photoresist mask 150 is conventionally stripped as shown in FIG. 11.

Figure 12:
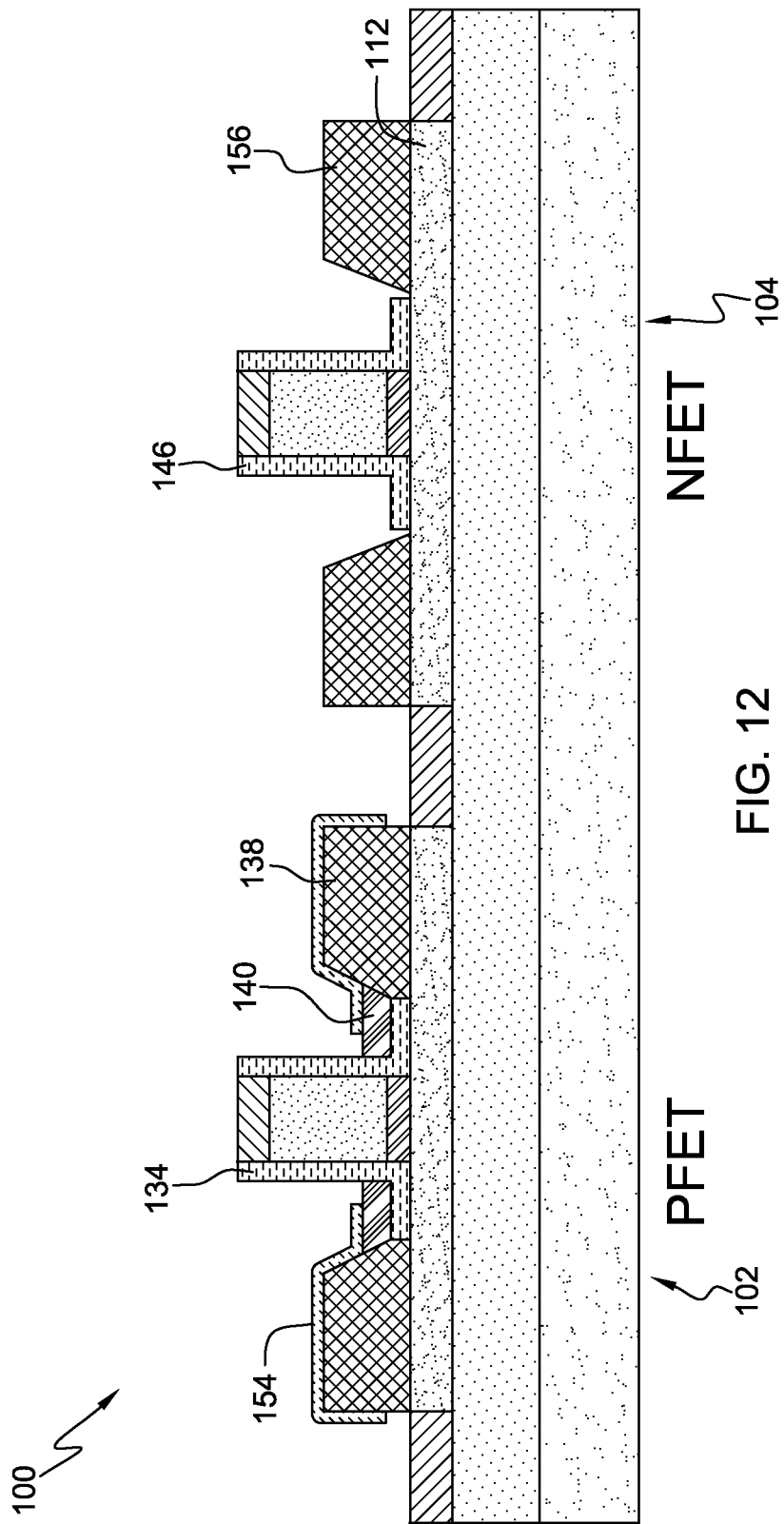

As now shown in FIG. 12, the semiconductor structure is etched in dilute HF to remove the disposable spacers 144 from the PFET portion 102 and disposable spacers 148 from the NFET portion 104. The dilute HF does not affect the spacers 134, 146 in the PFET portion 102 and the NFET portion 104, respectively. Then, the semiconductor structure 100 undergoes a cyclic epitaxial process to grow cyclic epitaxial silicon on the NFET portion 104.

Cyclic epitaxial deposition involves deposition and etch cycles. During the deposition cycle, crystalline epitaxial silicon is grown off exposed silicon from the ETSOI layer 112 because the silicon in the ETSOI layer 112 is crystalline. Amorphous silicon is deposited on non-crystalline surfaces such as the amorphous silicon in layer 154 and the nitride in spacers 134, 146 in the PFET portion 102 and the NFET portion 104, respectively. During the etch cycle, the process is tuned to etch away the amorphous silicon. Since the layer 154 on top of the SiGe RSD 138 was rendered amorphous by the prior implantation that formed layer 154, amorphous silicon is deposited on the PFET portion 102 and this amorphous silicon will get etched in the subsequent etch cycle. By controlling the etch cycles, it is possible to grow crystalline RSD 156 on the crystalline silicon in the ETSOI layer 112 in the NFET portion 104 without growing crystalline silicon on the PFET portion 102. Masking the PFET portion 102 during the cyclic epitaxial silicon process thus become unnecessary.

Figure 17:
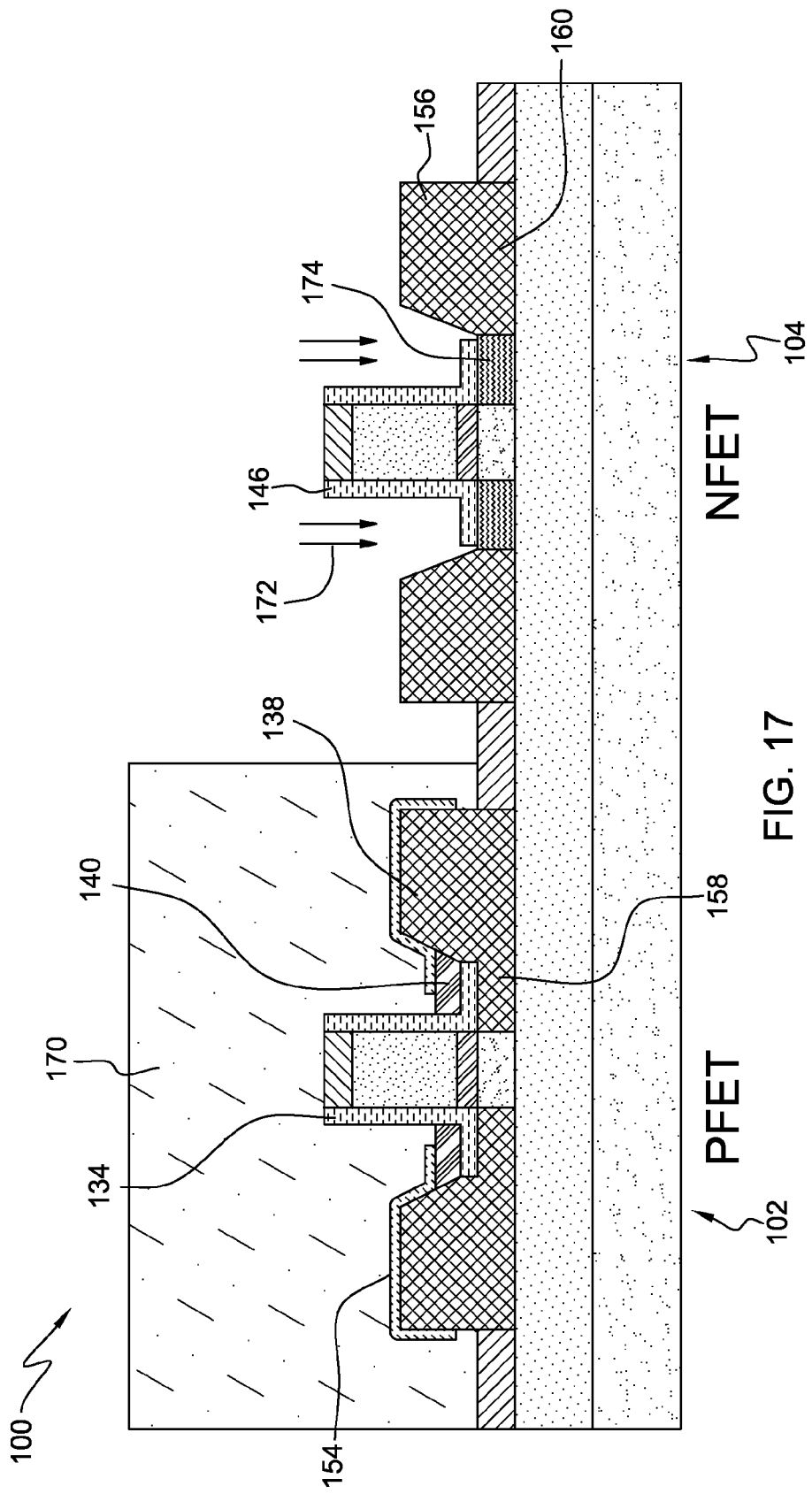

The crystalline RSD 156 may be in-situ phosphorus doped (ISPD) silicon, ISPD silicon carbide (SiC) or undoped silicon. The semiconductor structure 100 would then undergo a rapid thermal anneal to drive in boron from the ISBD SiGe RSD 138 into PFET extension regions 158 and NFET RSD 156 into ETSOI region 160 for better/lower link-up resistance as shown in FIG. 17.

Figure 13:
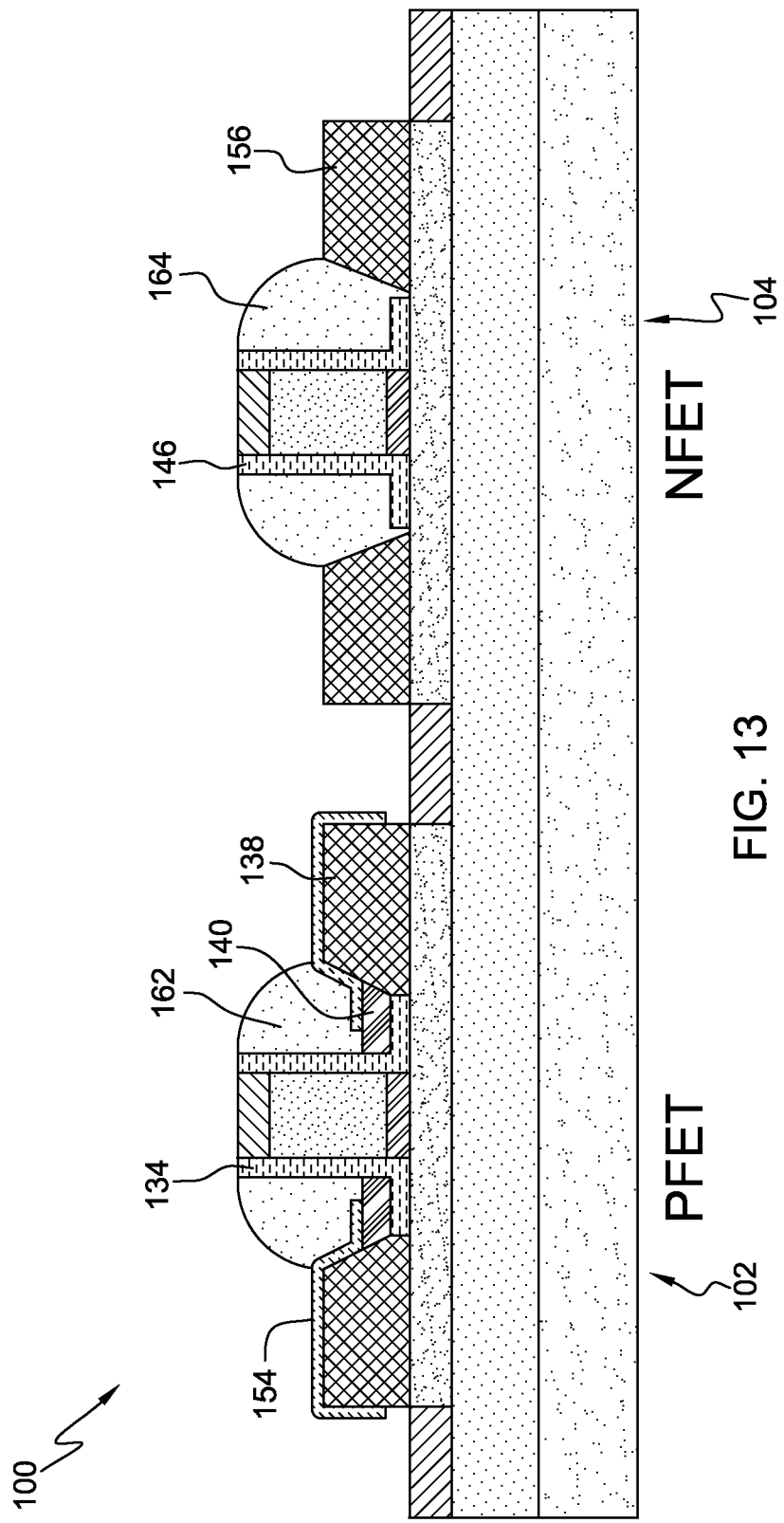
Figure 14:
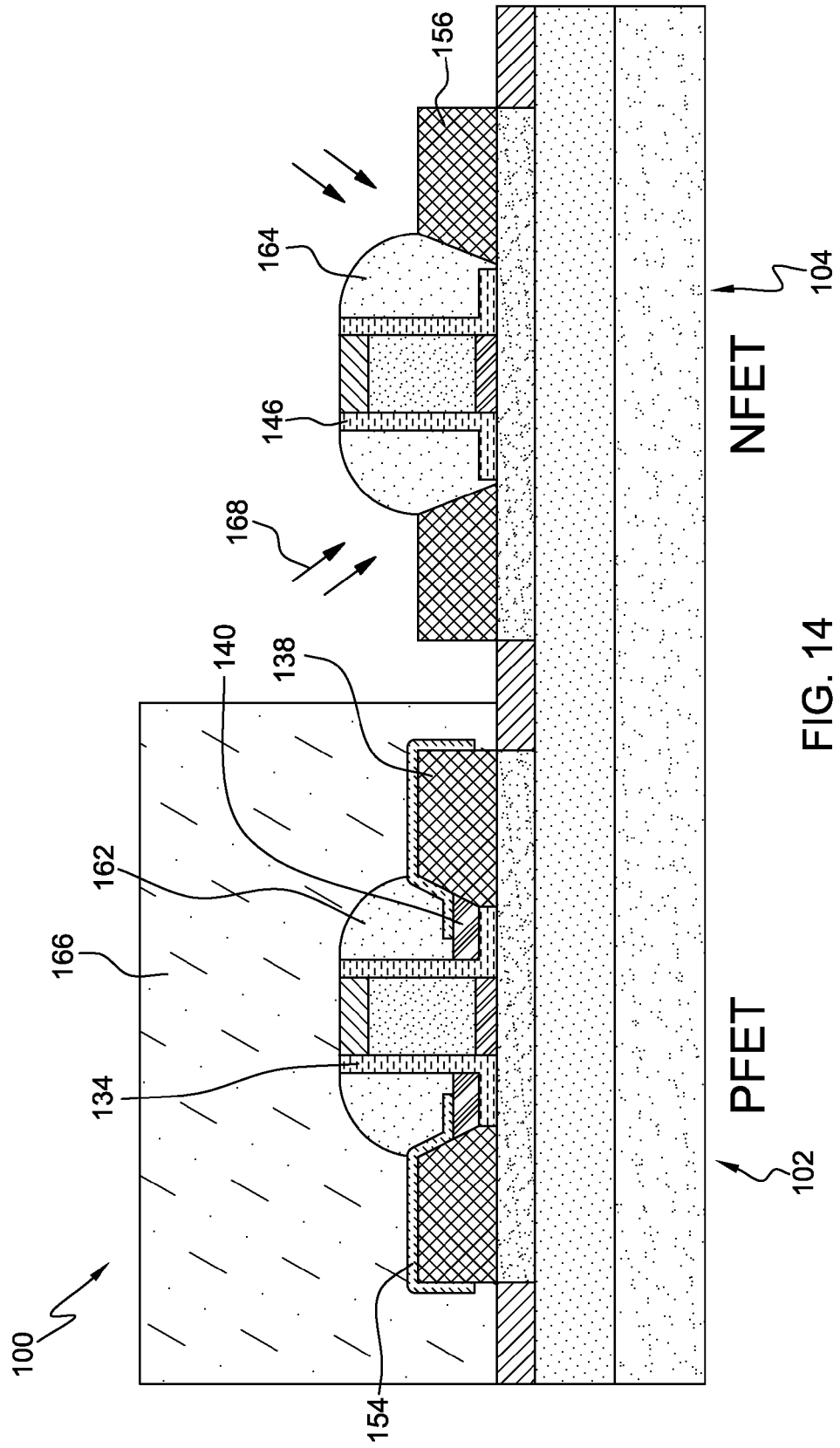
Figure 15:
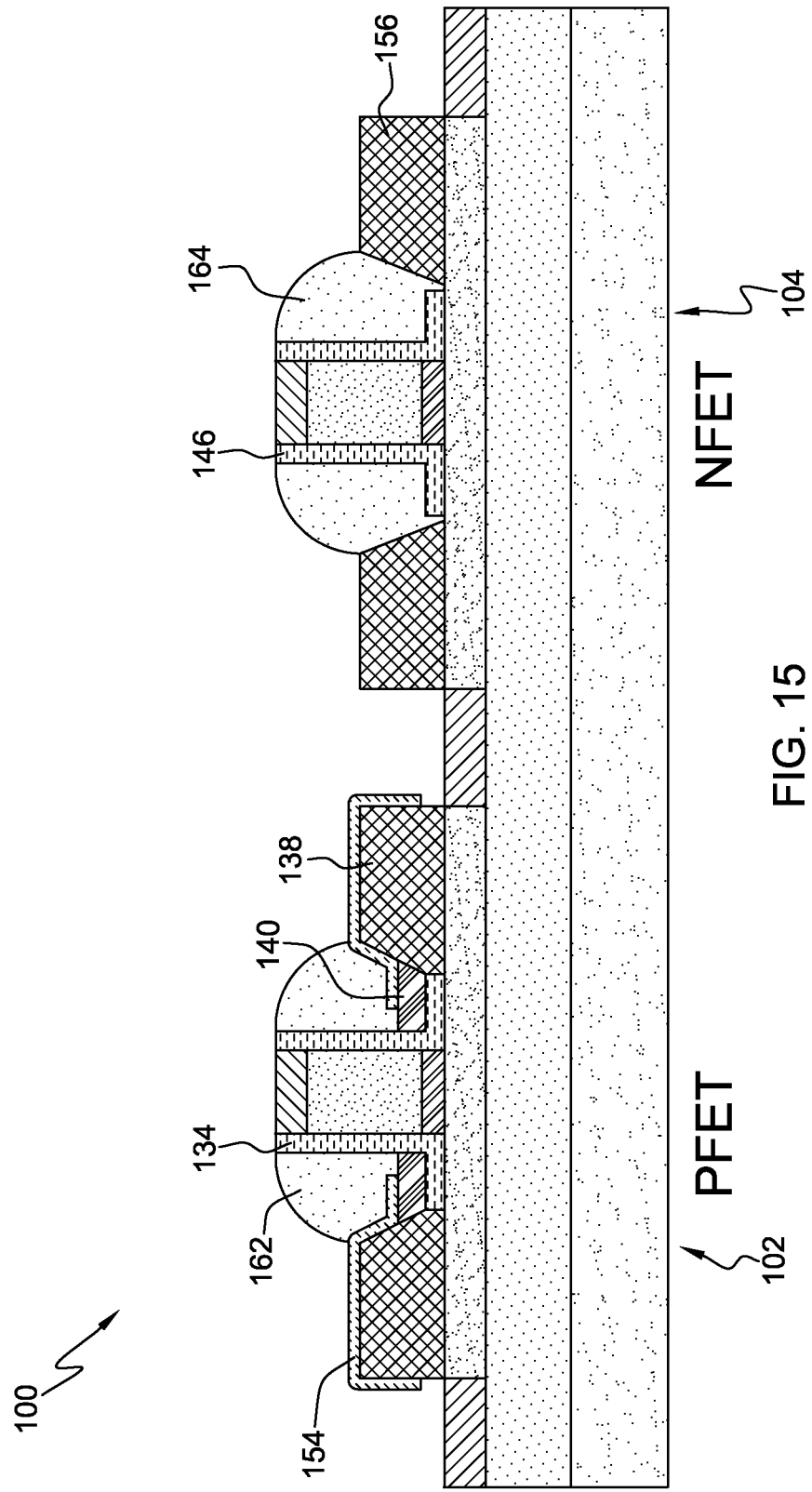
Figure 16:
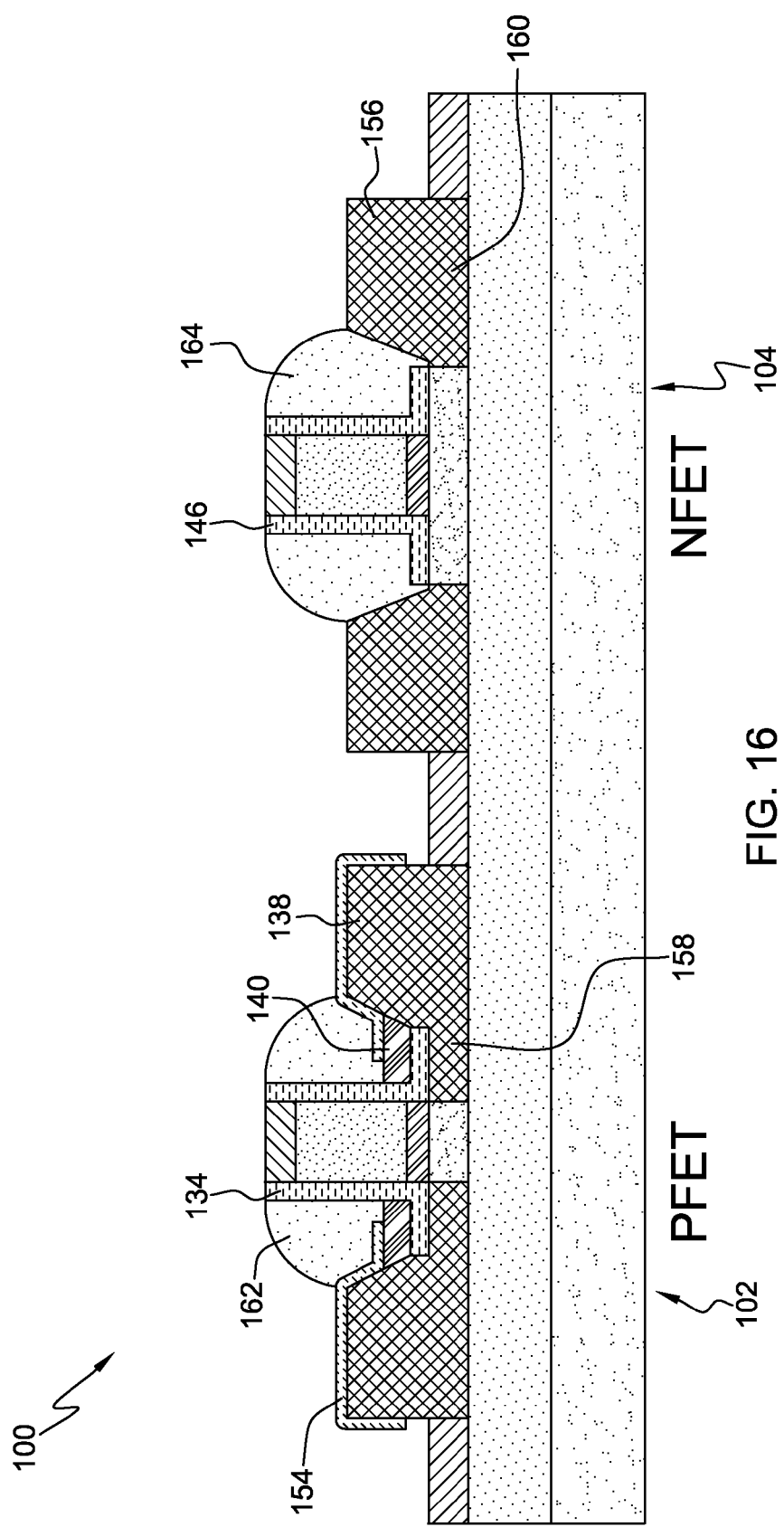

If the crystalline RSD 156 is undoped silicon, further processing is necessary to dope the RSD 156. This further processing is illustrated in FIGS. 13 to 16. Referring first to FIG. 13, an oxide is deposited and then reactive ion etched to form spacers 162 in PFET portion 102 and spacers 164 in NFET portion 104. Then, as shown in FIG. 14, a photolithographic mask 166 is patterned over the PFET portion 102 to protect the PFET portion 102 while exposing the NFET portion 104. The RSD 156 may then be exposed to conventional ion implanting 168 to dope the RSD 156 with, for example, phosphorus or arsenic or antimony. The photolithographic mask 166 is then stripped as shown in FIG. 15. The semiconductor structure 100 would then undergo a rapid thermal anneal to drive in boron from the ISBD SiGe RSD 138 into PFET extension regions 158 and NFET RSD 156 into ETSOI region 160 for better/lower link-up resistance as shown in FIG. 16. The dopants in NFET RSD 156 essentially do not diffuse into the NFET extension regions because of the low diffusion constant of the phosphorus/arsenic/antimony dopants in NFET RSD 156. The oxide spacers 162, 164 may be removed by a dilute HF etch.

Referring again to FIG. 17, a photolithographic mask 170 is patterned over the PFET portion 102 to protect the PFET portion 102 while exposing the NFET portion 104. The NFET portion 104 may then be exposed to conventional ion implanting to ion implant 172 to form extensions 174 in NFET portion 104. The implanted species may be phosphorus, arsenic or antimony but arsenic or antimony are preferred because they are heavier than phosphorus and may lead to much sharper doping profiles.

Figure 18:
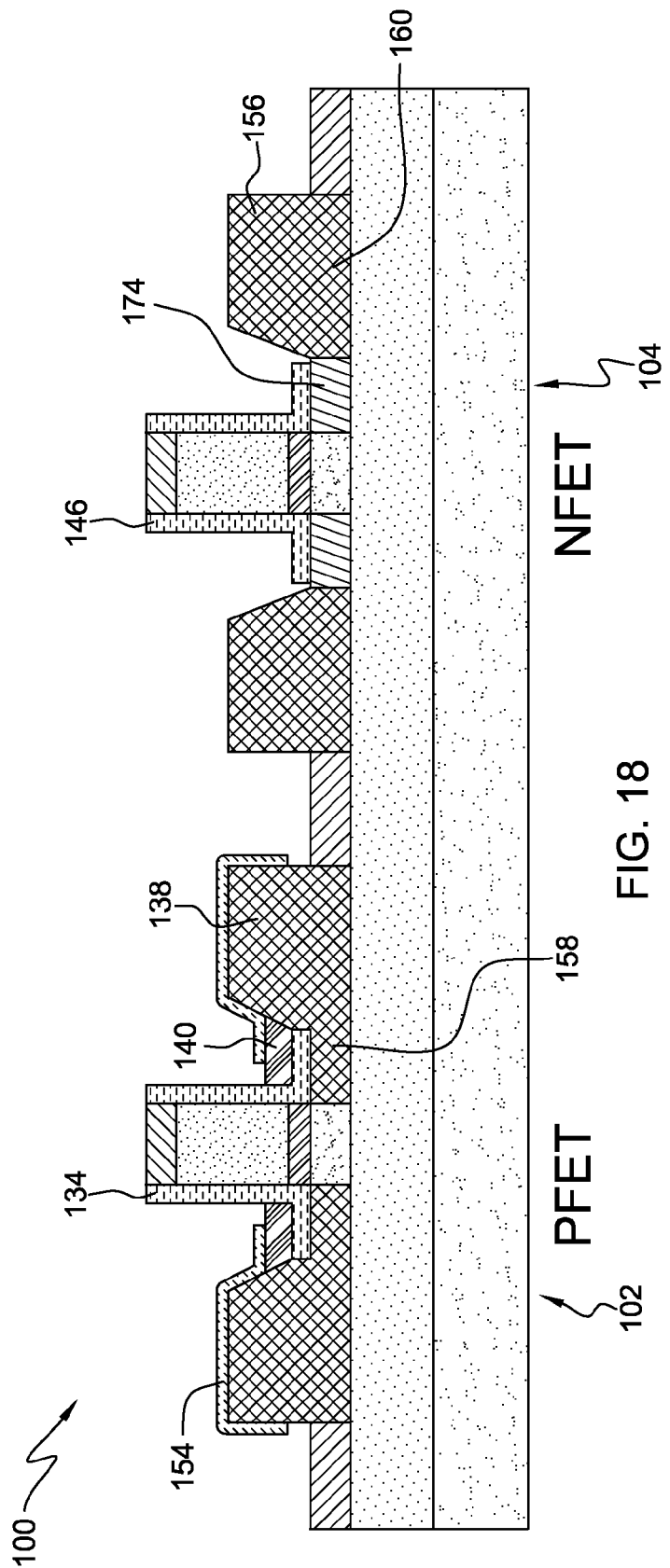

The photolithographic mask 170 is conventionally stripped as shown in FIG. 18. Then, a short time anneal such as a laser anneal or a flash anneal is performed on semiconductor structure 100 to activate the NFET extension implants 174 but not to diffuse them. A conventional rapid thermal anneal is greater than one second in duration. However, a laser anneal is about 1 millisecond and a flash anneal is about 10 milliseconds which are too short in time to lead to any significant diffusion of the dopants.

Figure 19:
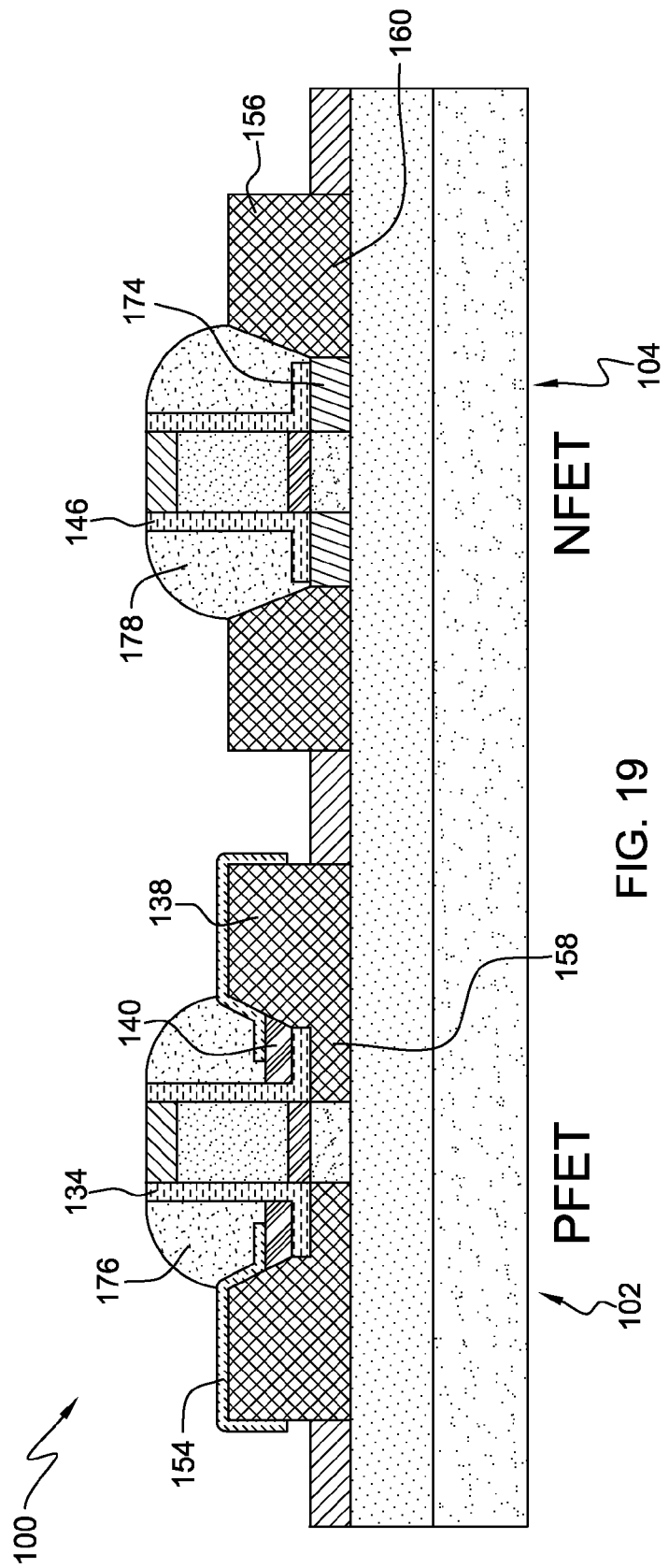

Referring now to FIG. 19, nitride spacers 176, 178 are formed by depositing nitride and then reactive ion etching to form nitride spacers 176 on PFET portion 102 and nitride spacers 178 on NFET portion 104.

Figure 20:
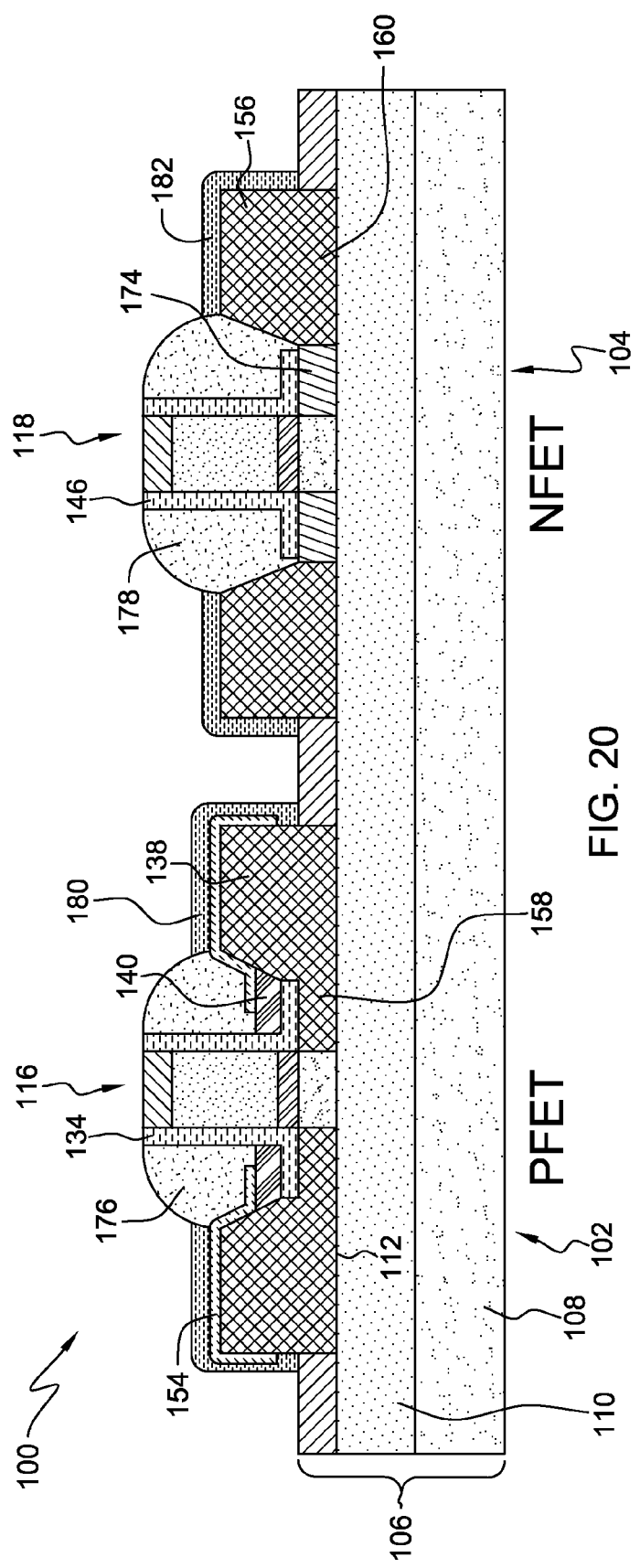

Conventional silicide processing then may be performed to form silicide 180 in PFET region 102 and silicide 182 in NFET region 104 as illustrated in FIG. 20.

Further conventional front end of the line, middle of the line and back end of the line processing may be performed to form finished semiconductor devices from semiconductor structure 100.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a semiconductor structure comprising:
   (a) obtaining an extra thin semiconductor on insulator (ET-SOI) wafer having a PFET portion where a p-type field effect transistor (PFET) will be formed and an NFET portion where an n-type field effect transistor (NFET) will be formed;

(b) forming at least one gate structure in the PFET portion and at least one gate structure in the NFET portion;

(c) depositing a high quality nitride over the PFET portion and the NFET portion, the high quality nitride being unetchable in dilute hydrofluoric acid (HF);

(d) depositing a low quality nitride over the high quality nitride, the low quality nitride being etchable in dilute HF;

(e) etching the PFET portion to remove the high quality nitride and low quality nitride except for high quality nitride and low quality nitride adjacent to the at least one gate structure in the PFET portion;

(f) etching the PFET portion and the NFET portion to remove the low quality nitride;

(g) forming a doped faceted epitaxial silicon/germanium (SiGe) on the ETSOI adjacent to the high quality nitride and the at least one gate structure in the PFET portion to form a faceted raised source/drain (RSD) in the PFET portion and an amorphous portion on the high quality nitride;

(h) depositing a low quality nitride over the PFET portion and the NFET portion;

(i) etching the PFET portion to remove the low quality nitride while maintaining the low quality nitride adjacent to the high quality nitride and at least one gate structure to form disposable spacers from the low quality nitride adjacent to the high quality nitride and etching the NFET portion to remove the low quality nitride and high quality nitride except for high quality nitride and low quality nitride adjacent to the at least one gate structure in the NFET portion, the low quality nitride adjacent to the at least one gate structure in the NFET portion forming disposable spacers;

(j) ion implanting into the RSD in the PFET portion to render amorphous a top portion of the RSD in the PFET portion;

(k) etching the disposable spacers adjacent the at least one gate structure in the NFET portion and the PFET portion to leave at least the high quality nitride adjacent to the at least one gate structure in the PFET portion and at least the high quality nitride adjacent to the at least one gate structure in the NFET portion;

(l) forming a faceted epitaxial silicon RSD on the ETSOI adjacent to the at least one gate structure in the NFET portion;

(m) performing a rapid thermal anneal;

(n) ion implanting extensions into the ETSOI underneath the at least one gate structure in the NFET portion; and (o) performing a short time scale anneal to activate the NFET extension implants but not diffuse them.

2. The method of claim 1 wherein step (i) comprises two etching steps such that a first etching step comprises etching the low quality nitride from the PFET portion and the NFET portion and a second etching step comprises etching the high quality nitride from the NFET portion wherein the second etching step has different etching parameters than the first etching step.

3. The method of claim 1 wherein forming in step (i) comprises a cyclic epitaxial process.

4. The method of claim 3 wherein epitaxial material is not formed on the RSD in the PFET portion during the cyclic epitaxial process.

5. The method of claim 1 wherein the epitaxial silicon formed in step (l) is undoped silicon.

6. The method of claim 5 further comprising the steps between step (l) and step (m) of forming oxide spacers adjacent to the high quality nitride in the NFET portion, masking the PFET portion and ion implanting into the RSD in the NFET portion and step (m) of performing a rapid thermal anneal includes driving in dopants of the RSD into the ETSOI in the PFET portion and NFET portion.

7. The method of claim 1 wherein the epitaxial silicon formed in step (l) is doped silicon and step (m) of performing a rapid thermal anneal includes driving in dopants of the RSD into the ETSOI in the PFET portion and NFET portion.

8. The method of claim 1 wherein the short time anneal in step (o) is a laser anneal or a flash anneal such that the anneal time is less than 10 milliseconds.

9. The method of claim 1 further comprising a step (p) of forming nitride spacers adjacent to the at least one gate structure in the PFET portion and the at least one gate structure in the NFET portion.

10. The method of claim 1 wherein dilute HF may be defined as having a range of HF:$H_2O$ (water) from 1:10 to 1:100 and the high quality nitride is a nitride that has an etch rate in dilute hydrofluoric (HF) acid of less than about 1 nanometer per minute.

11. The method of claim 10 wherein the low quality nitride has an etch rate in dilute HF of more than about 10 nanometers per minute.

* * * * *